(12) United States Patent
Luisier et al.

(10) Patent No.: US 8,309,989 B2
(45) Date of Patent: Nov. 13, 2012

(54) TUNNELING FIELD-EFFECT TRANSISTOR WITH LOW LEAKAGE CURRENT

(75) Inventors: Mathieu Luisier, West Lafayette, IN (US); Samarth Agarwal, West Lafayette, IN (US); Gerhard Klimeck, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 104 days.

(21) Appl. No.: 12/858,465

(22) Filed: Aug. 18, 2010

(65) Prior Publication Data

US 2012/0043607 A1 Feb. 23, 2012

(51) Int. Cl.
*H01L 31/072* (2012.01)
(52) U.S. Cl. ... 257/192; 257/335; 257/347; 257/E21.41; 257/E29.255
(58) Field of Classification Search .................. 257/192, 257/335, 347, E21.41, E29.255
See application file for complete search history.

(56) References Cited

U.S. PATENT DOCUMENTS

2011/0303950 A1* 12/2011 Lauer et al. .................... 257/192

OTHER PUBLICATIONS

Hu et al., "Green Transistor—A VDD Scaling path for Future Low Power ICs", Dept. of Electrical Engineering and Computer Sciences, Univ of CA, Berkeley, Apr. 2008 (2 pgs.).
Appenzeller et al., "Band-to-Band Tunneling in Carbon Nanotube Field-Effect Transistors", IBM T.J. Watson Research Center, Yorktown heights, NY, Nov. 5, 2004 (pp. 196805-1 thru 196805-4).
Krishnamohan et al., "Double-Gate Strained-Ge Heterostructure Tunneling FET (TFET) with Record High Drive Currents and <60mV/dec Subthreshold Slope", Stanford Univ., Intel Corporation, Dec. 2008 (3 pgs.).
Luisier et al., "Atomistic Full-Band Design Study of InAs Band-to-Band Tunneling Field-Effect Transistors", IEEE Electron Device Letters, vol. 30, No. 6, Jun. 2009 (pp. 602-604).
Luisier et al., "Performance Comparisons of Tunneling Field-Effect Transistors made of InSb, Carbon, and GaSb-InAs Broken Gap Heterostructures", Network for Computational Nanotechnology and Birck Nanotechnology Center, Purdue Univ., 2009 (pp. 37.6.1-37.6.4).
Choi et al., "Tunneling Field-Effect Transistors (TFETs) with Sub-threshold Swing (SS) less Than 60 mV/dec", IEEE Electron Device Letters, vol. 28, No. 8, Aug. 2007 (pp. 743-745).
Chenming Hu, "Green Transistor as a Solution to the IC Power Crisis", Dept. of Electrical Engineering and Computer Sciences, Univ. of Ca, Oct. 2008 (4 pgs.).
Bowonder et al., "Low-Voltage Green Transistor Using Ultra Shallow Junction and Hetero-Tunneling", Dept. of Electrical Engineering and Computer Sciences, Univ. of CA, 2008 (4 pgs.).

* cited by examiner

*Primary Examiner* — Long Pham
(74) *Attorney, Agent, or Firm* — Barnes & Thornburg LLP

(57) ABSTRACT

Illustrative embodiments of a vertical tunneling field effect transistor are disclosed which may comprise a semiconductor body including a source region doped with a first dopant type and a pocket region doped with a second dopant type, where the pocket region is formed above the source region. The transistor may also comprise an insulated gate formed above the source and pocket regions, the insulated gate being configured to generate electron tunneling between the source and pocket regions if a voltage is applied to the insulated gate. The transistor may further comprise a lateral tunneling barrier formed to substantially prevent electron tunneling between the source region and a drain region of the semiconductor body, where the drain region is doped with the second dopant type.

10 Claims, 8 Drawing Sheets

TUNNELING FIELD-EFFECT TRANSISTOR WITH LOW LEAKAGE CURRENT

GOVERNMENT RIGHTS

Part of the work during the development of this invention was funded with government support from the National Science Foundation under grants EEC-0634750 and OCI-0749140; the United States Government may have certain rights in the invention.

TECHNICAL FIELD

The present disclosure relates generally to tunneling field-effect transistors ("TFETs") and, more particularly, to TFETs with relatively low leakage current.

BACKGROUND

All transistors consume power in two distinct ways: (1) during an OFF state (i.e., standby), when a leakage current flows through the transistor, even though it is not needed, and (2) during an ON/OFF switching operation, when surrounding circuits are charged and discharged due to a voltage change on the transistor that changes the transistor state between OFF and ON. To reduce power consumption, it is desirable to reduce both the leakage current present during the OFF state and the voltage swing used for the ON/OFF switching operation as much as possible. The ON/OFF voltage swing may be characterized by the subthreshold slope ("SS"), also sometimes referred to as the subthreshold swing. Conventional metal-oxide-silicon field-effect transistors ("MOSFETs") are fundamentally limited to a lower bound SS of 60 mV/decade (at room temperature) that cannot be reduced.

TFETs have been designed to reduce the SS beyond this limit and, thereby, to allow further reductions in the ON/OFF voltage swing. In TFETs, the cold injection of valence electrons located in a source contact into the conduction band of a drain contact (or vice versa) does not impose any theoretical lower limit to the SS. Most TFET designs, however, are based on lateral tunneling and suffer from relatively low ON currents, due to a small available tunneling area. More recently, TFETs using a vertical band-to-band tunneling ("BTBT") approach, similar to the gate induced drain leakage ("GIDL") mechanism present in conventional MOSFETs, have been proposed. Vertical BTBT has the advantage of a large tunneling area, proportional to the gate length of the transistor, that should provide large ON currents. Due to their potential power savings, vertical TFETs have sometimes been referred to as "green-FETs," or "gFETs."

Various TFET designs and other background principles are described in: J. Appenzeller et al., "Band-to-Band Tunneling in Carbon Nanotube Field-Effect Transistors," 93 Physics Rev. Letters 196805 (2004); A. Bowonder et al. "Low-Voltage Green Transistor Using Ultra Shallow Junction and Heterotunneling," 8th Int'l Workshop on Junction Tech. 93-96 (2008); W. Y. Choi et al., "Tunneling Field-Effect Transistors (TFETs) with Subthreshold Swing (SS) Less Than 60 mV/dec," 28 Electron Device Letters 743-745 (2007); C. Hu, "Green Transistor as a Solution to the IC Power Crisis," 9th Intl Conf. on Solid-State & Integrated-Circuit Tech. 16-23 (2008); C. Hu et al, "Green Transistor—A $V_{DD}$ Scaling Path for Future Low Power ICs," Int'l Symp. on VLSI Tech., Sys. & Applications 14-15, 21-23 (2008); T. Krishnamohan et al., "Doublegate Strained-Ge Heterostructure Tunneling FET (TFET) with Record High Drive Currents and <60 mV/dec Subthreshold Slope," Electron Devices Meeting 1-3 (2008); M. Luisier et al., "Atomistic Full-Band Design Study of InAs Band-to-Band Tunneling Field-Effect Transistors," 30 IEEE Electron Device Letters 602-604 (2009); and M. Luisier et al., "Performance Comparisons of Tunneling Field-Effect Transistors Made of InSb, Carbon, and GaSb—InAs Broken Gap Heterostructures," Electron Devices Meeting (2009). The entire disclosures of each of the above listed references is expressly incorporated herein by reference. This listing is not intended as a representation that a complete search of all relevant prior art has been conducted or that no better reference than those listed above exist; nor should any such representation be inferred.

SUMMARY

The present invention comprises one or more of the features recited in the appended claims and/or the following features which, alone or in any combination, may comprise patentable subject matter.

According to one aspect, a transistor comprises a semiconductor body including a source region doped with a first dopant type and a pocket region doped with a second dopant type, where the pocket region is formed above the source region. The transistor also comprises an insulated gate formed above the source and pocket regions, the insulated gate being configured to generate electron tunneling between the source and pocket regions if a voltage is applied to the insulated gate. The transistor further comprises a lateral tunneling barrier formed to substantially prevent electron tunneling between the source region and a drain region of the semiconductor body, where the drain region is doped with the second dopant type.

In some embodiments, the insulated gate may be configured to open a vertical tunneling channel between the source and pocket regions, the vertical tunneling channel having an area that is proportional to the length of the insulated gate. The lateral tunneling barrier may comprise an oxide. The semiconductor body may be formed above a buried oxide layer and the lateral tunneling barrier may comprise a portion of the buried oxide layer. In other embodiments, the lateral tunneling barrier may comprise a high band-gap semiconductor. In such embodiments, the lateral tunneling barrier may comprise a portion of the semiconductor body. The high band-gap semiconductor may have a larger band gap than a transition region positioned between the pocket region and the drain region.

In other embodiments, the length of the pocket region extending under the insulated gate may be no more than 75% of the length of the insulated gate. The second dopant type in the pocket region may have a concentration of at least $4 \times 10^{19}$ $cm^{-3}$. A combined thickness of the source and pocket regions may be about 15 nm. In some embodiments, the first dopant type may comprise acceptor atoms and the second dopant type comprises donor atoms. In other embodiments, the first dopant type may comprise donor atoms and the second dopant type comprises acceptor atoms.

According to another aspect, a transistor may comprise a buried oxide layer having a first surface and a lateral tunneling barrier extending above the first surface, a semiconductor source region formed on the first surface of the buried oxide layer, a semiconductor pocket region formed on the source region, the source and pocket regions being configured to generate electron tunneling therebetween if subjected to an electric field, and a semiconductor drain region formed on the lateral tunneling barrier of the buried oxide layer, where the lateral tunneling barrier substantially prevents electron tunneling between the source and drain regions.

In some embodiments, the source region may be doped with a first dopant type and the pocket and drain regions may be doped with a second dopant type, where the first dopant type is different than the second dopant type. The lateral tunneling barrier may extend a distance above the first surface that is substantially equal to a thickness of the source region between the first surface and the pocket region.

According to yet another aspect, a transistor may comprise a gate formed above a dielectric layer, a semiconductor pocket region formed below the gate and the dielectric layer, a semiconductor source region formed below the dielectric layer, where at least a portion of the source region extends below the pocket region and the gate, a semiconductor drain region formed below the dielectric layer, and a tunneling barrier formed below the drain region and adjacent to the source region, where the tunneling barrier substantially preventing electron tunneling between the source and drain regions.

In some embodiments, the gate may be configured to open a vertical tunneling channel between the pocket region and the portion of the source region extending below the pocket region and the gate, where the vertical tunneling channel has an area that is proportional to the length of the gate. The tunneling barrier may comprise a dielectric. In other embodiments, the tunneling barrier may comprise a high band-gap semiconductor. In such embodiments, the high band-gap semiconductor may have a larger band gap than a semiconductor transition region positioned between the pocket region and the drain region.

Additional features, which alone or in combination with any other feature(s), including those listed above and those listed in the claims, may comprise patentable subject matter and will become apparent to those skilled in the art upon consideration of the following detailed description of illustrative embodiments exemplifying the best mode of carrying out the invention as presently perceived.

BRIEF DESCRIPTION OF THE DRAWINGS

The detailed description particularly refers to the accompanying figures in which.

DETAILED DESCRIPTION OF THE DRAWINGS

Figure 1:
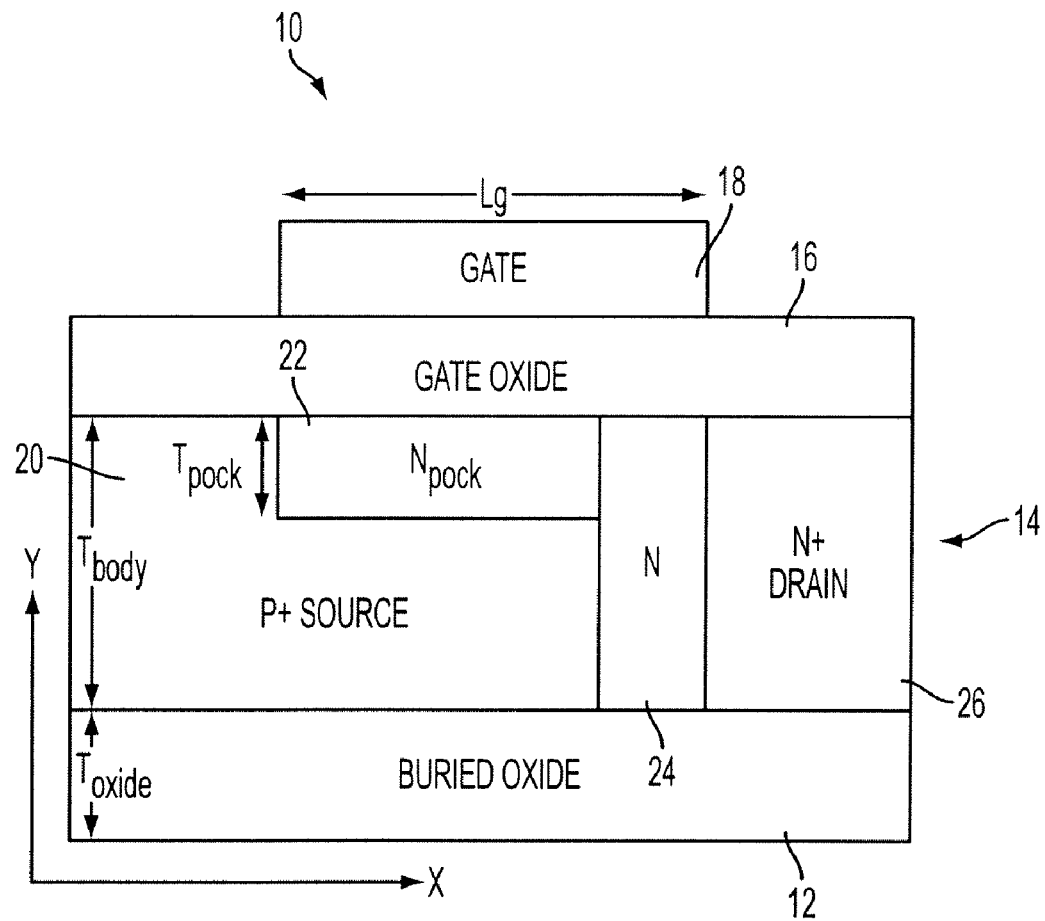
FIG. 1 is a diagram of one embodiment of a vertical TFET which suffers from lateral tunneling between its source and drain regions.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but, on the contrary, the intention is to cover all modifications, equivalents, and alternatives falling within the spirit and scope of the invention as defined by the appended claims.

In addition, various features of the disclosed devices are described herein as being formed "above" another feature, "below" another feature, "on" another feature, and the like. It will be appreciated that these and other directional words (e.g., "vertical" and "lateral") merely denote relative position and/or orientation and that any of the presently disclosed structures may be inverted and/or rotated relative to an arbitrary frame of reference. Moreover, the formation of a first feature "above" or "below" a second feature may include embodiments in which the first and second features are formed in direct contact and may also include embodiments in which additional features are formed between the first and second features.

One illustrative embodiment of a vertical TFET 10 is shown in FIG. 1. This illustrative vertical TFET 10 has a similar construction to those described in C. Hu, "Green Transistor as a Solution to the IC Power Crisis" (cited above) and generally includes a buried oxide layer 12, a semiconductor body 14, a gate oxide 16, and a gate 18. While the buried oxide layer 12 and the gate oxide 16 are formed of an oxide material in the illustrative embodiment, it is contemplated that these structures may be formed of any dielectric or insulating material, in other embodiments. The gate 18 may be formed of any conductive material, including metals, alloys, polysilicon, polycrystalline silicon, and the like. As can be seen in FIG. 1, the gate 18 is insulated from the semiconductor body 14 by the gate oxide 16.

The semiconductor body 14 of the vertical TFET 10 is formed to include several regions 20-26 of differing doping profiles, as depicted in FIG. 1. In the illustrative embodiment, the semiconductor body 14 comprises Indium Arsenide ("InAs"). In other embodiments, other semiconductor materials (e.g., silicon, germanium, gallium arsenide, et cetera) may be used to form the semiconductor body 14. Using appropriately chosen impurities (depending on the particular semiconductor employed), regions of the semiconductor body 14 may be selectively doped with donor or acceptor atoms to create n-type and p-type regions, respectively. As shown in the illustrative embodiment of FIG. 1, the semiconductor body 14 has been formed to include a p+-doped source region 20, a thin and highly n-doped pocket region 22, a lightly n-doped transition region 24, and an n+-doped drain region 26.

In the illustrative embodiment of the vertical TFET 10, the length of the gate 18 ($L_g$) is 40 nm, the thickness of the semiconductor body 14 ($T_{body}$) is 10 nm, the thickness of the pocket region 22 ($T_{pock}$) is 5 nm, the length of the transition region 24 is 5 nm, and the gate oxide 16 has an equivalent oxide thickness (EOT) of 0.5 nm. In addition, the illustrative vertical TFET 10 has a source region 20 doping ($N_A$) of $2\times10^{19}$ cm$^{-3}$, a pocket region 22 doping ($N_{pock}$) of $2\times10^{19}$ cm$^{-3}$, a transition region 24 doping of $2\times10^{18}$ cm$^{-3}$, and a drain region 26 doping ($N_D$) of $2\times10^{19}$ cm$^{-3}$. Finally, the vertical TFET 10 is designed to receive a supply voltage ($V_{DD}$) of 0.5 V. It will be appreciated that, although the regions 20-26 of the semiconductor body 14 have been described as being doped with a particular dopant type, the dopant types may be reversed in some embodiments.

During operation, electron tunneling occurs between the thin pocket region 22 (implanted just below the gate 18 and gate oxide 16) and the portion of source region 20 which extends below the pocket region 22 and the gate 18. Specifically, BTBT occurs between the valence band ("VB") electrons of the p+ source region 20 and the available confined conduction band ("CB") states of the n+ pocket region 22. A voltage applied to the gate 18 serves to lower the potential of the CB edge of the pocket region 22 below the potential of the VB edge of the source region 20 and opens a vertical tunneling channel whose area is proportional to the length of the gate 18 ($L_g$). This vertical tunneling approach of TFET 10 allows for a larger tunneling area, such that relatively high ON currents are expected.

Although vertical TFETs, such as the illustrative embodiment just described, offer larger ON currents than their lateral TFET counterparts, the present inventors have discovered that such vertical TFETs suffer from lateral source-to-drain tunneling leakage current. This effect may increase the OFF current of vertical TFET 10 by several orders of magnitude and may make any steep SS impossible. These problems render the device largely unsuitable for low power logic applications. The newly discovered reason for the high OFF currents of the vertical TFET 10 is the presence of undesired lateral tunneling far away from the gate oxide 16, in regions where the gate 18 has no control of the electrostatics. This effect has been wholly neglected in previous theoretical studies of the vertical TFET 10.

The illustrative vertical TFET 10 of FIG. 1 was simulated using an atomistic, full-band quantum transport solver based on the $sp^3s^*$ nearest-neighbor tight-binding method and a wave function approach. In these simulations, transport was treated in the ballistic limit and electron-phonon scattering was not included. Furthermore, gate leakage currents and spin-orbit coupling were neglected (for computational reasons), which would not alter the conclusions. The tight-binding model accurately and simultaneously describes the conduction and the valence bands of most semiconductor materials, as well as the imaginary bands coupling them (which are responsible for tunneling). Contrary to standard TFET simulators where tunneling is treated as a perturbation in the Wentzel—Kramers—Brillouin approximation and only exists in pre-defined regions, the present simulations were characterized by a global tunneling model (i.e., tunneling is present everywhere by default). Hence, it was not necessary to specify the regions where tunneling was expected to take place and no crucial tunneling path was omitted.

Figure 2:
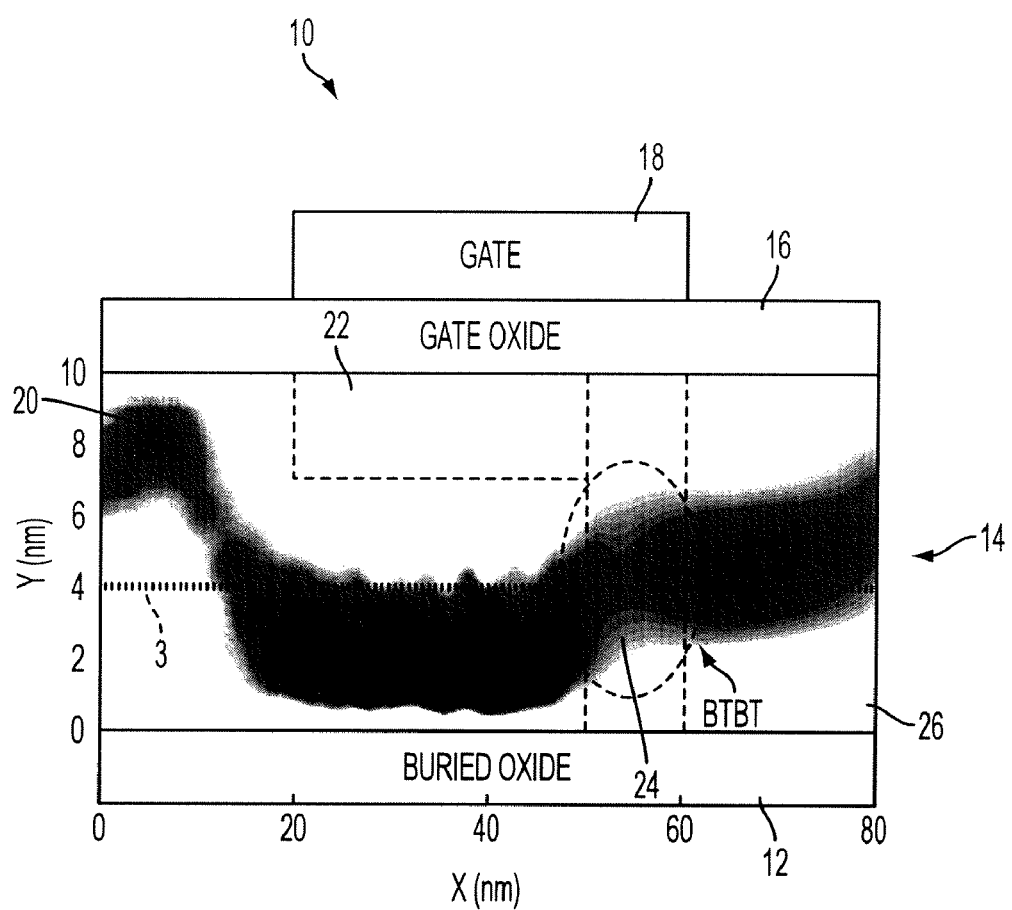
FIG. 2 illustrates a spatial leakage current of the vertical TFET of FIG. 1 in an OFF state.
Figure 3:
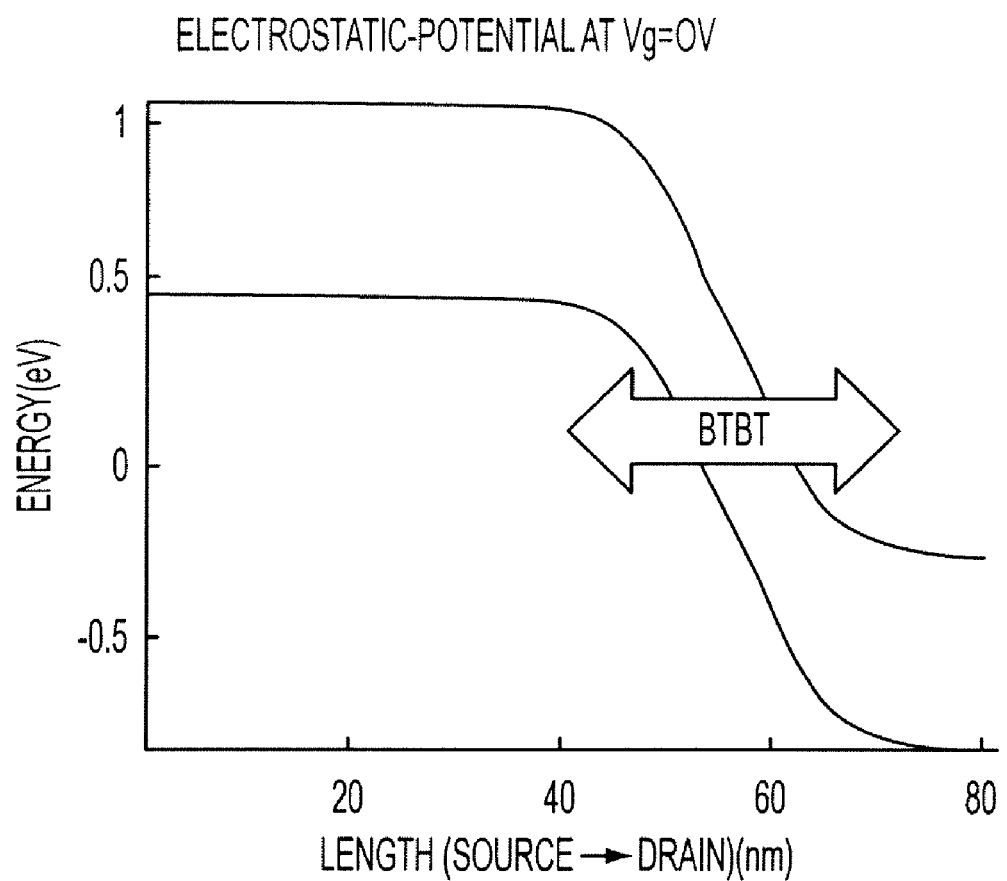
FIG. 3 is a band diagram illustrating conduction band and valence band profiles in the lateral direction of the vertical TFET of FIG. 1, along the line 3 in FIG. 2.

As expected, the simulation resulted in a relatively large ON current ($I_{ON}=I_d$ at $V_{gs}=V_{ds}=V_{DD}$) for the vertical TFET 10 (180 µA/µm). The diagram of FIG. 2, showing the spatial current flow during the OFF state of the vertical TFET 10, however, clearly indicates lateral tunneling through the transition region 24 close to the buried oxide layer 12. This lateral tunneling results in a very high leakage current in the OFF stage of the vertical TFET 10 ($I_{OFF}=I_d$ at $V_{gs}=0$ V and $V_{ds}=V_{DD}$). The band diagram of the vertical TFET 10 extracted along line 3 (of FIG. 2) and plotted in FIG. 3 confirms this observation. The VB of the source region 20 is situated above the CB of the drain region 26 so that lateral tunneling becomes possible. In fact, the transition region 24 at this depth resembles a lateral p-i-n structure that the gate 18 cannot control due to its distance.

Figure 4:
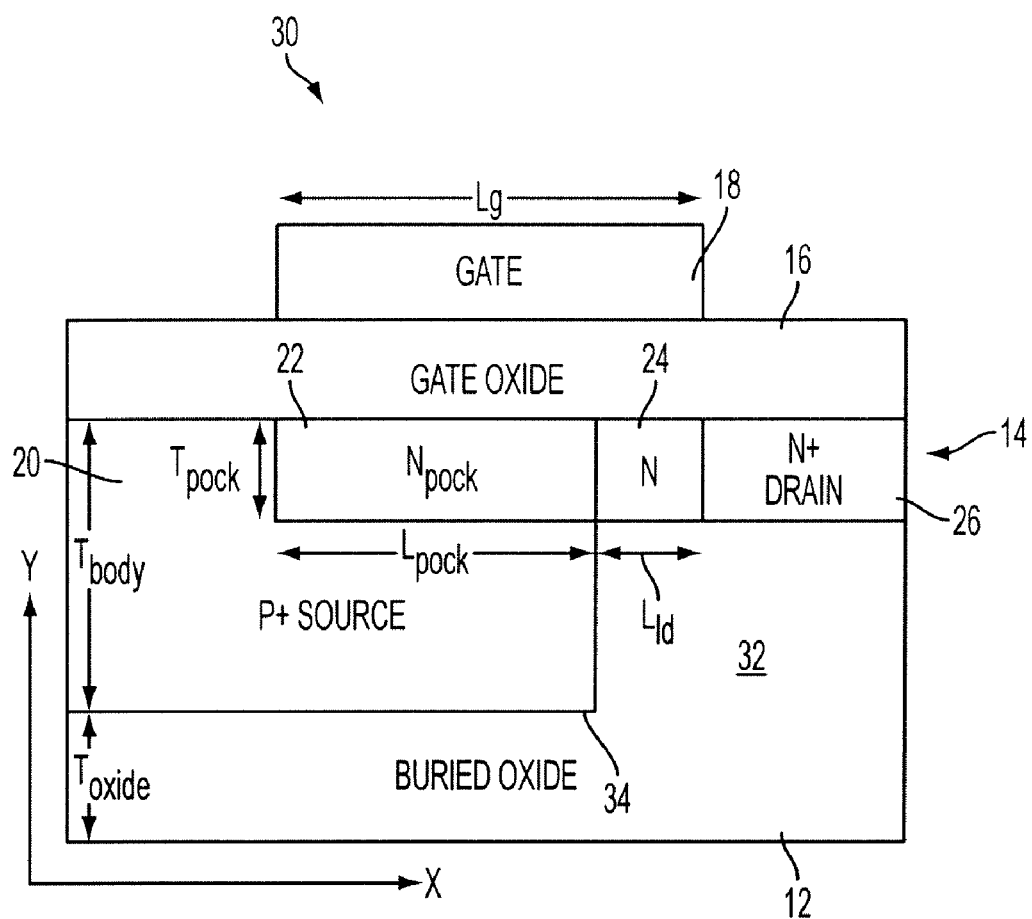
FIG. 4 is a diagram of one embodiment of a modified vertical TFET structure including a lateral tunneling barrier.

According to the present disclosure, one illustrative embodiment of a modified vertical TFET 30 is presented in FIG. 4. The modified vertical TFET 30 has several similar components to the vertical TFET 10, and the same reference numerals are used to identify these similar components in the figures. Furthermore, the foregoing description of the structure of vertical TFET 10 is generally applicable to the modified vertical TFET 30, except as otherwise noted below.

The modified vertical TFET 30 includes a lateral tunneling barrier 32 formed to substantially prevent electron tunneling between the source region 20 and the drain region 26 of the semiconductor body 14. The lateral tunneling barrier 32 is positioned in the relatively inactive portions (during the ON state) of the drain region 26 and the transition region 24. As such, the lateral tunneling barrier 32 will reduce the OFF state leakage current by blocking most, if not all, of the lateral BTBT pathways (see FIG. 2), while not substantially interfering with the ON current.

In the illustrative embodiment of FIG. 4, the lateral tunneling barrier 32 is formed using an oxide. In fact, the lateral tunneling barrier 32 is illustratively embodied as a raised portion of the buried oxide layer 12 in modified vertical TFET 30. As shown in FIG. 4, the buried oxide layer 12 generally has a first surface 34 on which the source region 20 of the semiconductor body 14 is formed. The lateral tunneling barrier 32 extends above this first surface 34, adjacent to the source region 20, to prevent electron tunneling between the source region 20 and the drain region 26. In the illustrative embodiment, the lateral tunneling barrier 32 extends up to a lower edge of the pocket region 22. It is contemplated that, in other embodiments (not shown), the lateral tunneling barrier 32 may be formed of a high band-gap semiconductor and, thus, may be formed as a region of the semiconductor body 14. In such embodiments, the high band-gap semiconductor may be chosen to have a larger band gap than the transition region 24, in order to effectively prevent most lateral electron tunneling between the source region 20 and the drain region 26.

Figure 5:
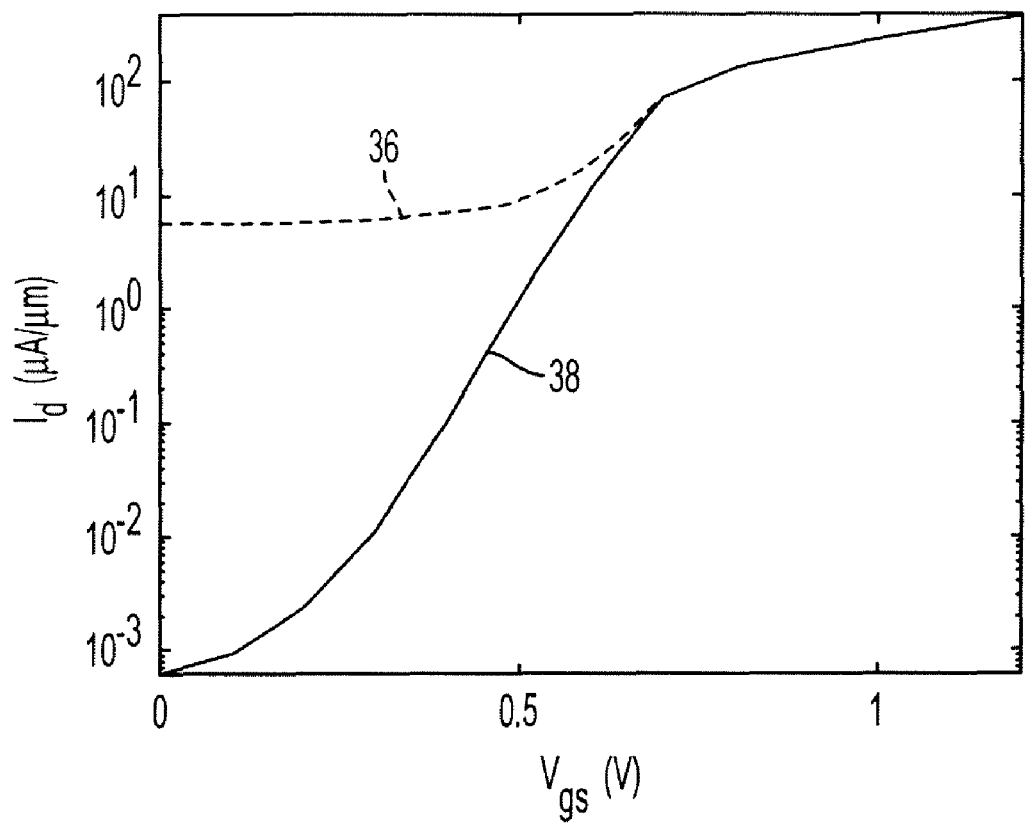
FIG. 5 illustrates the transfer characteristics (drain current v. gate-to-source voltage) of both the vertical TFET of FIG. 1 and the modified vertical TFET of FIG. 4.

The lateral tunneling barrier 32 of the modified vertical TFET 30, according to the present disclosure, may reduce the OFF current by more than four orders of magnitude (as compared to the vertical TFET 10). As described above, simulations were run using an atomistic, full-band quantum transport simulator taking BTBT into account everywhere in the structure of modified vertical TFET 30. The results of these simulations are graphed in FIG. 5, which compares the transfer characteristics of the vertical TFET 10 (as line 36) and the modified vertical TFET 30 (as line 38) and demonstrates that $I_{OFF}$ is reduced by several orders of magnitude for the TFET 30, without affecting $I_{ON}$. Thus, the modified vertical TFET 30 of FIG. 4 still obtains a high ON/OFF current ratio and a steep SS.

Figure 6:
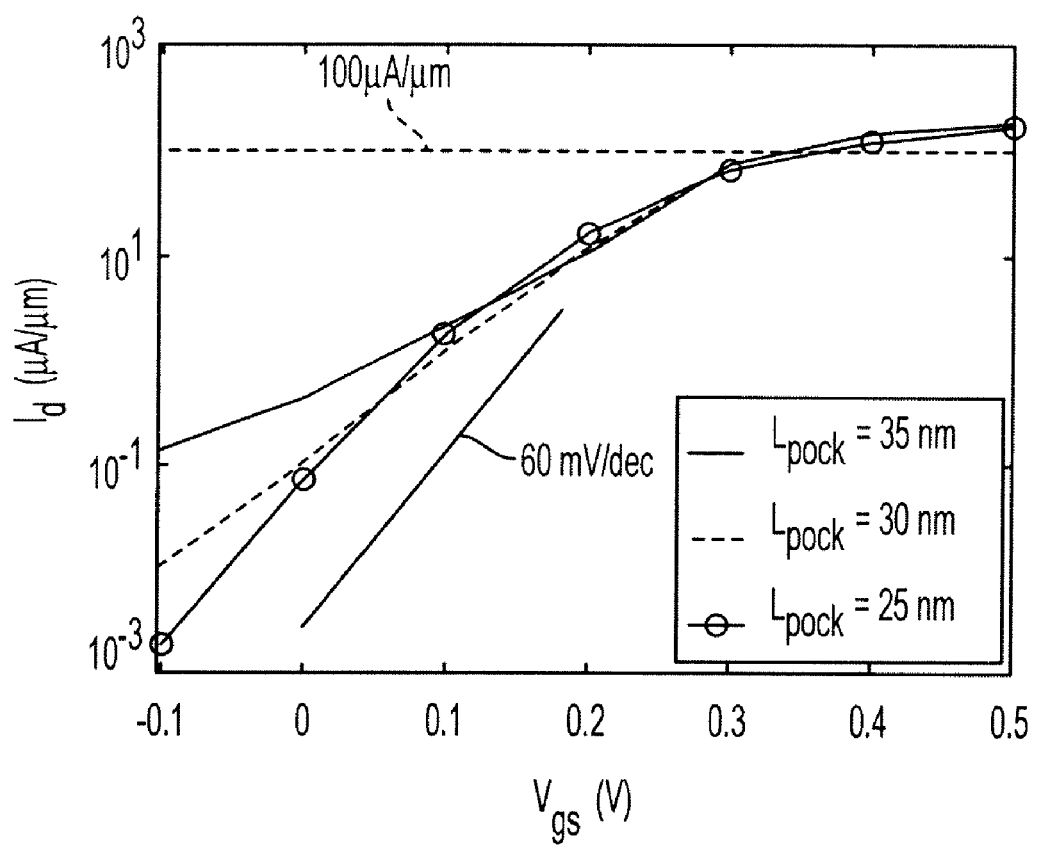
FIG. 6 illustrates the transfer characteristics of the modified vertical TFET of FIG. 4 with various pocket lengths, $L_{pock}$.

The ON current and SS of the modified vertical TFET 30 may be further improved by optimizing one or more of the thickness of the semiconductor body 14 ($T_{body}$), the length of the pocket region 22 ($L_{pock}$), the thickness of the pocket region 22 ($T_{pock}$), and the doping of the pocket region 22 ($N_{pock}$). The graph of FIG. 6 illustrates the effect of $L_{pock}$ on the transfer characteristics ($I_d$-$V_{gs}$) of the modified vertical TFET 30. As can be seen in FIG. 6, a decrease in $L_{pock}$, and a corresponding increase in $L_{Id}$ (the length of the gate, $L_g=L_{pock}+L_{Id}$, remaining constant), leads to a further reduction of the OFF current and of the SS. Although positioning the lateral tunneling barrier 32 below the drain region 26 suppressed most of the source-to-drain leakage currents, some diagonal paths joining the source region 20 and the drain region 26 persisted. Increasing $L_{Id}$ makes these tunneling paths longer and, therefore, reduces $I_{OFF}$ and SS. It will be appreciated that the tunneling ON current, which is roughly proportional to $L_{pock}$, will slightly decrease in this embodiment (approximately a 10% reduction when $L_{pock}$ decreases from 35 nm to 25 nm).

Figure 7:
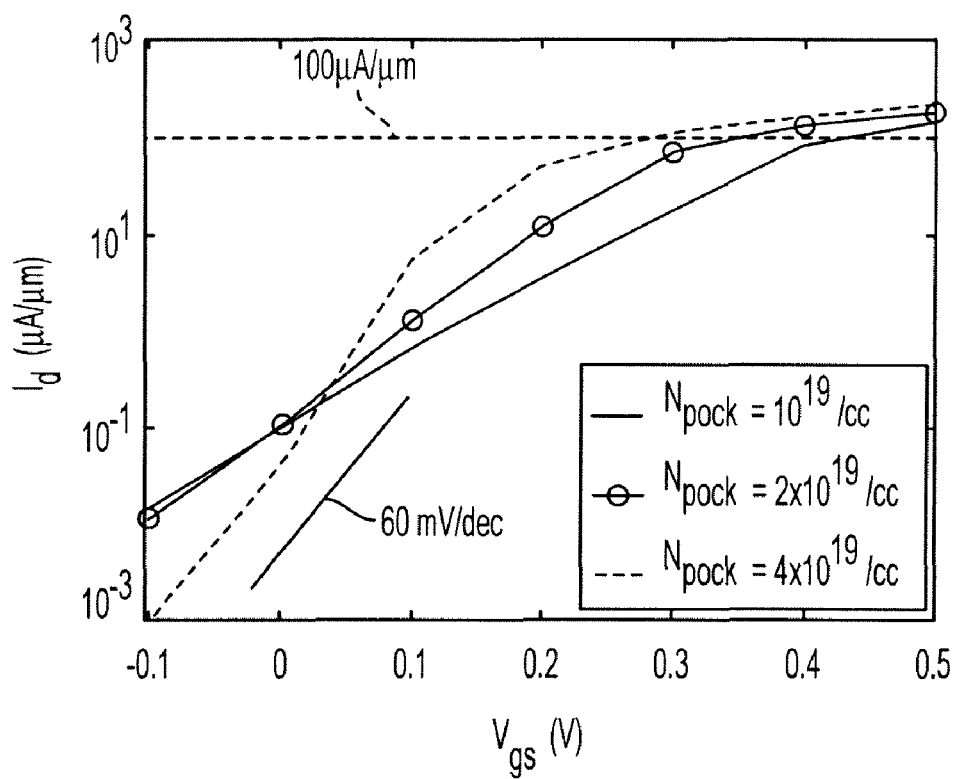
FIG. 7 illustrates the transfer characteristics of the modified vertical TFET of FIG. 4 with various pocket dopings, $N_{pock}$.
Figure 8:
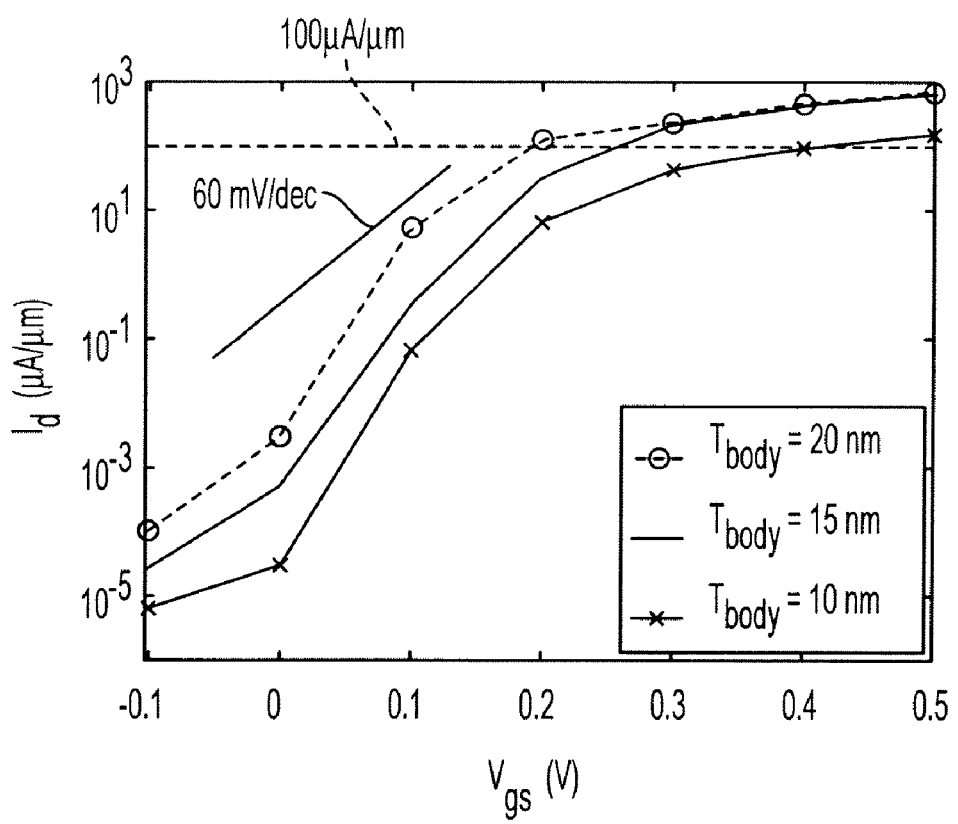
FIG. 8 illustrates the transfer characteristics of the modified vertical TFET of FIG. 4 with various body thicknesses, $T_{body}$.

As can be seen in FIG. 7, increasing $N_{pock}$ (the doping of the pocket region 22) will induce larger vertical electric fields so that the tunneling length between the source region 20 and the pocket region 22 becomes smaller, the current magnitude larger, and the SS steeper. Hence, SS reduces from 118 mV/dec for $N_{pock}=10^{19}$ cm$^{-3}$ to 47 mV/dec for $N_{pock}=4\times10^{19}$ cm$^{-3}$, while $I_{ON}$ increases from 143 μA/μm to 220 μA/μm. In a similar fashion, a reduction in $T_{pock}$ (the thickness of the pocket region 22) also improves $I_{ON}$ and SS. The influence of changes to $T_{body}$ (the overall thickness of the semiconductor body 14) is illustrated in the graph of FIG. 8. Increasing the voltage applied to the gate 18 not only pushes down the VB and CB of the pocket region 22 close to the gate oxide 16 ($\Delta V_p$), as desired, but also deeper into the source region 20 ($\Delta V_s$). $\Delta V_s$ will always be less than $\Delta V_p$, since the influence of the gate 18 decreases as function of distance, but $\Delta V_s$ should also be as small as possible to maximize the electric field between the pocket region 22 and the source region 20 (and, thus, the vertical tunneling current). Increasing $T_{body}$ from 10 to 15 nm helps reduce $\Delta V_s$ and increase $I_{ON}$. According to these optimizations, the illustrative embodiment of modified vertical TFET 30 employs $T_{body}=15$ nm, $L_{pock}=25$ nm, $T_{pock}=3$ nm, $N_{pock}=4\times10^{19}$ cm$^{-3}$, and $L_g=40$ nm (with all other parameters being the same as vertical TFET 10, described above). Using these parameters in the simulation, the modified vertical TFET 30 achieved an intrinsic $I_{ON}$ of 667 μA/μm (no contact series resistance), $I_{OFF}$ of $10^{-3}$ μA/μm, and SS of 36 mV/decade.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present invention and fall within the spirit and scope of the present disclosure as defined by the appended claims.

The invention claimed is:

1. A transistor comprising:
a semiconductor body including a source region doped with a first dopant type and a pocket region doped with a second dopant type, the pocket region being formed above the source region, the semiconductor body further including a drain region doped with the second dopant type and a transition region positioned between the pocket region and the drain region;
an insulated gate formed above the source and pocket regions, the insulated gate being configured to generate electron tunneling between the source and pocket regions if a voltage is applied to the insulated gate; and
a lateral tunneling barrier formed to substantially prevent electron tunneling between the source region and the drain region of the semiconductor body, the lateral tunneling barrier comprising a high band-gap semiconductor having a larger band gap than the transition region.

2. The transistor of claim 1 wherein the insulated gate is configured to open a vertical tunneling channel between the source and pocket regions, the vertical tunneling channel having an area that is proportional to a length of the insulated gate.

3. The transistor of claim 1, wherein the lateral tunneling barrier comprises a portion of the semiconductor body.

4. The transistor of claim 1, wherein a length of the pocket region extending under the insulated gate is no more than 75% of a length of the insulated gate.

5. The transistor of claim 1, wherein the second dopant type in the pocket region has a concentration of at least $4\times10^{19}$ cm$^{-3}$.

6. The transistor of claim 1, wherein a combined thickness of the source and pocket regions is about 15 nm.

7. The transistor of claim 1, wherein the first dopant type comprises acceptor atoms and the second dopant type comprises donor atoms.

8. The transistor of claim 1, wherein the first dopant type comprises donor atoms and the second dopant type comprises acceptor atoms.

9. A transistor comprising:
a gate formed above a dielectric layer;
a semiconductor pocket region formed below the gate and the dielectric layer;
a semiconductor source region formed below the dielectric layer, at least a portion of the source region extending below the pocket region and the gate;
a semiconductor drain region formed below the dielectric layer;
a semiconductor transition region formed below the dielectric layer and positioned between the pocket region and the drain region; and
a high band-gap semiconductor tunneling barrier formed below the drain region and the transition region and adjacent to the source region, the tunneling barrier having a larger band-gap than the transition region and substantially preventing electron tunneling between the source and drain regions.

10. The transistor of claim 9 wherein the gate is configured to open a vertical tunneling channel between the pocket region and the portion of the source region extending below the pocket region and the gate, the vertical tunneling channel having an area that is proportional to a length of the gate.

* * * * *